(12) United States Patent
Krilic

(10) Patent No.: US 8,437,176 B2
(45) Date of Patent: May 7, 2013

(54) OPTICAL REFRESHING OF LOADLESS FOR TRANSISTOR SRAM CELLS

(76) Inventor: Goran Krilic, Zagreb (HR)

( * ) Notice: Subject to any disclaimer, the term of this patent is extended or adjusted under 35 U.S.C. 154(b) by 64 days.

(21) Appl. No.: 12/311,518

(22) PCT Filed: Oct. 3, 2007

(86) PCT No.: PCT/IB2007/003105
§ 371 (c)(1),
(2), (4) Date: Apr. 2, 2009

(87) PCT Pub. No.: WO2008/044139
PCT Pub. Date: Apr. 17, 2008

(65) Prior Publication Data
US 2010/0034013 A1    Feb. 11, 2010

(30) Foreign Application Priority Data
Oct. 11, 2006 (WO) ................. PCT/IB2006/002978

(51) Int. Cl.
*G11C 11/00* (2006.01)
(52) U.S. Cl.
USPC ........... 365/154; 365/156; 365/215; 365/222; 365/109; 365/112; 365/234
(58) Field of Classification Search ............ 365/154, 365/156, 215, 222, 109, 112, 234
See application file for complete search history.

(56) References Cited

U.S. PATENT DOCUMENTS

| 6,442,060 B1* | 8/2002 | Leung et al. .............. 365/154 |
| 2003/0117833 A1 | 6/2003 | Marr |
| 2006/0049338 A1* | 3/2006 | Sherazi et al. .......... 250/214 R |
| 2007/0177883 A1* | 8/2007 | Kagaya et al. .............. 398/202 |

FOREIGN PATENT DOCUMENTS

| EP | 0 310 351 A1 | 4/1989 |
| WO | WO 2004/084307 A | 9/2004 |
| WO | WO 2006/021827 A | 3/2006 |

OTHER PUBLICATIONS

Takata H. et al, "Opticallly Coupled Three-Dimensional Comon Memory With Novel Data Transfer Method" Japanese Journal of Applied Physics, Tokyo, JP Aug. 28, 1989 Japan Society of Applied Physics, Tokyo, Japan.
Written Opinion of the International Searching Authority PCT ISA , European Patent Office, Munich.

\* cited by examiner

*Primary Examiner* — Fernando Hidalgo
(74) *Attorney, Agent, or Firm* — Shalini Venkatesh

(57) ABSTRACT

Loadless 4 transistor SRAM cell operation can be substantially improved, yielding area saving and more stable operation by use of optical-light load. Parasitic photocurrents in PMOS anodes-substrate junctions act as load currents. Light can be introduced by either ambient light through transparent window on top of the chip or by cheap LED diode attached to chip surface.

9 Claims, 4 Drawing Sheets

OPTICAL REFRESHING OF LOADLESS FOR TRANSISTOR SRAM CELLS

TECHNICAL FIELD OF THE INVENTION

Invention relates to static random access memory devices. In particular it is related to loadless 4 transistor SRAMs.

BACKGROUND OF THE INVENTION

Loadless static RAM memories implemented in CMOS technology, consisting of two NMOS driver transistors and two PMOS pass transistors are well known. PMOS pass transistors supply load current as well However, the main drawback is difficulty to accurately control the nonselected wordline voltage to maintain the load current. If load current would be supplied by other source than PMOS's drain currents, it would make possible wide-voltage margin of the cell. This would enable simple standard CMOS process and design of peripheral circuits, as well as area saving Another type of static RAM cell is developed recently where NMOS pass transistors and PMOS drive transistors are used. PMOS drive transistors are connected between the storage nodes and a supply voltage.

Both aforementioned types of SRAM cells use only 4 transistors and enable area saving up to 46% compared to standard 6T SRAM cell However, they suffer from problems related to complex control circuitry yielding area penalty and narrow-voltage margin of cells.

BRIEF DESCRIPTION OF THE DRAWLINGS

DETAILED DESCRIPTION OF THE INVENTION

Aforementioned problems can be completely avoided if load current is supplied from source different than NMOS (PMOS) adjustable weak drain currents. Constant current source, independent of temperature and voltage, can be used in a form of photocurrents generated in parasitic PMOS transistors' PN photodiodes (N substrate-P drain and N substrate-P source). Light can be supplied from ambient through transparent window on top of SRAM chip, similarly as in UV EPROMs. Red part of the visible spectrum penetrate only few micrometers in the semiconductor causing useful photocurrent. Another option is attachment of ultra cheap (mass produced) red LED diode on top of chip. The price of the required miniature low power LED is in the order of 1% of the SRAM chip price.

DESCRIPTION OF THE EMBODIMENTS

Figure 1:
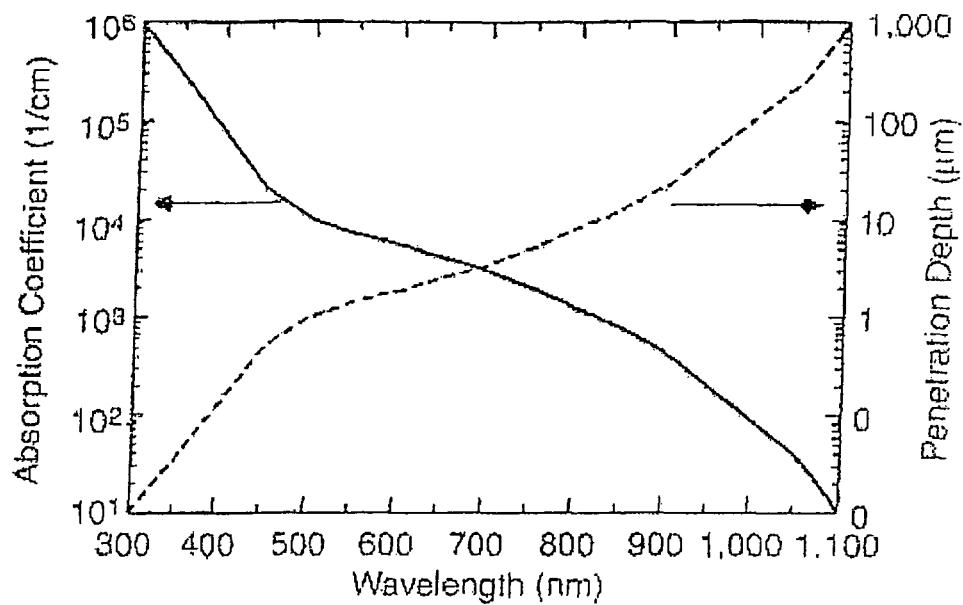
FIG. 1 is a graph showing light penetration in silicon.
Figure 2:
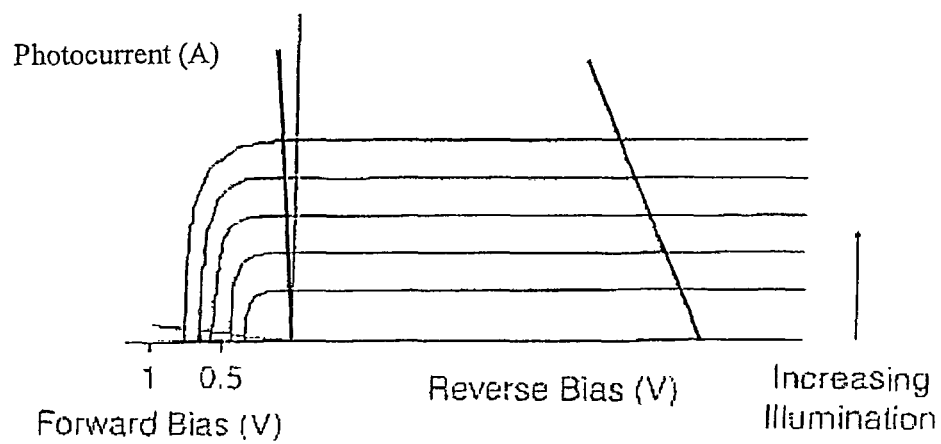
FIG. 2 shows the current-voltage charachterisitics of a PN photodiode.
Figure 3:
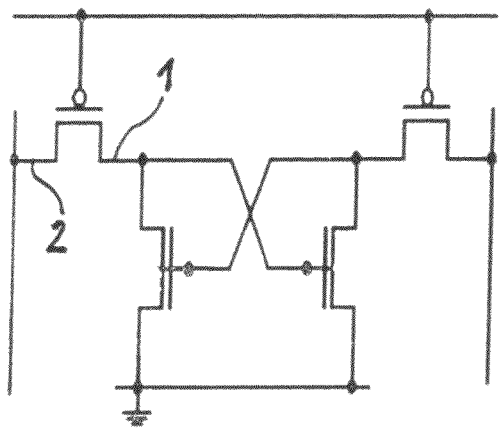
FIG. 3 shows a loadless four transistor SRAM cell with NMOS drivers.
Figure 4:
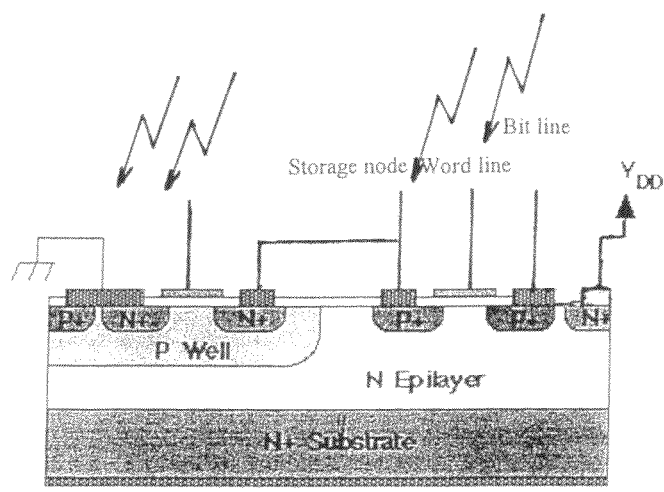
FIG. 4 is a cross section view of an optically refreshed loadless 4 transistor SRAM cell's PMOS pass and NMOS driver transistors implemented in P-well CMOS technology.
Figure 5:
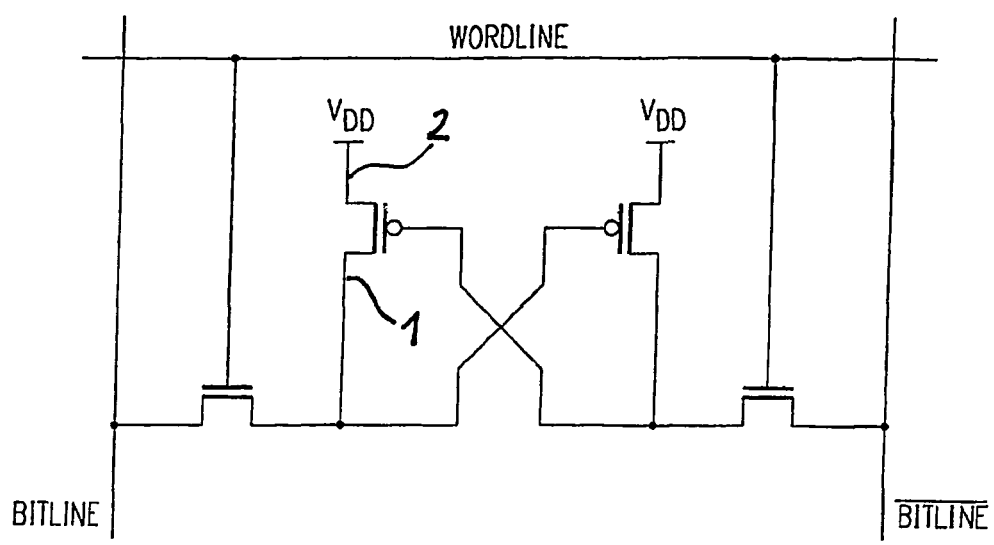
FIG. 5 shows a loadless four transistor SRAM cell with PMOS drivers.
Figure 6:
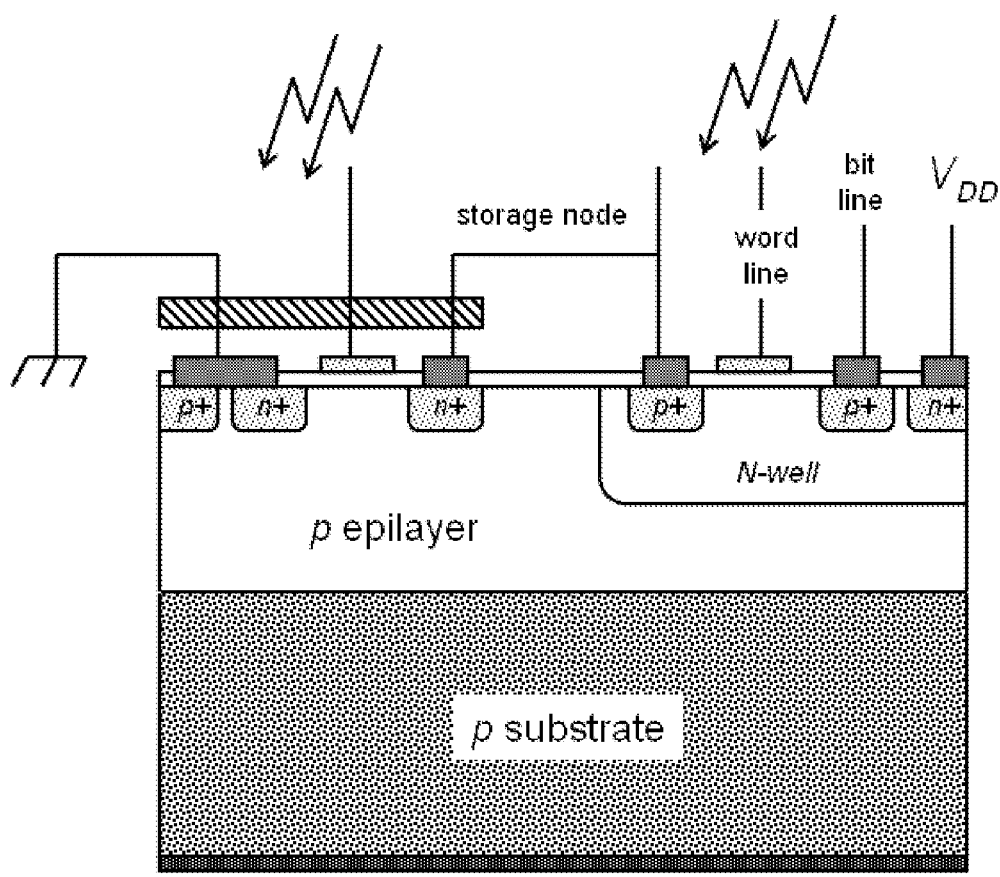
FIG. 6 is a cross section view of an optically refreshed loadless 4 transistor SRAM cell's PMOS pass and NMOS driver transistors implemented in N-well CMOS technology.

FIG. 3 shows 4 transistor SRAM cell with PMOS pass transistor. FIG. 4 shows NMOS and PMOS transistors (chip cross section) in P-well CMOS technology. In the first case, see FIG. 3, PMOS first drain/source terminal (1) is connected to storage node. Parasitic photodiode (N substrate on Vdd-PMOS drain/source terminal) provides optical-photocurrent load. In the second case, see FIG. 5, pass transistors are NMOS and PMOS drivers are connected between storage nodes and Vdd. First PMOS drain/source terminals (1), see FIG. 3, are connected to storage nodes providing photocurrent load. Second drain/source terminals (2) of PMOS transistors generate non useful photocurrents. it flows to bit line. Smaller part of load photocurrent is generated from direct absorption in P diffusion (drain/source terminal), see FIG. 4. Most of the light is generated between transistors and near the cell. Light generates electron-hole pairs which diffuse to either P diffusions, where they are separated in PN junctions' depletion layers under electrical field, generating load photocurrent or to grounded P wells. Grounded P wells thus act as a guard to unwanted photocurrents in N diffusions (NMOS drain/source terminals see FIG. 3 and FIG. 4) which tends to discharge storage node. Photocurrent flows always from positive cathode (N type) to grounded anode (P type). FIGS. 1 and 2 show light absorption/penetration in silicon and typical photodiodes characteristics with conductive (negative voltage) and photovoltaic (positive voltage) mode. Ambient light can be a small fraction (10%) of mobile phone display or keyboard backlight. 1 pA/um2 photocurrent may be generated which is sufficient for cell's static operation. The same method of optical loads can be used in 4T SRAMs made in N-well CMOS technology. Useful photocurrent is generated in N-well (Vdd)-P diffusion junctions. Area around N diffusions can be covered by dummy poly layer during poly layer deposition and patterning. This will make area around N diffusions opaque and thus poly layer acts as a guard to unwanted discharging photocurrents.

Different modifications of the aforementioned invention can be derived by those knowledgeable in the art. Standard 6 transistor SRAM cell can be optically refreshed in the same way as loadless 4 transistor cell as described herein. One of the PMOS load transistors can be ommited resulting in 17% area saving. Remaining PMOS transistor's drain/source N-well (or drain/source N substrate) PN junctions function as parasitic photodiodes which generate load photocurrents.

In case when LED diode light source is used pulsed operation is also possible in which case cell act as a periodically refreshable DRAM cell instead of SRAM cell Refreshing does not interfere with read/write like in classical electronically refreshable DRAM cells.

The invention claimed is:

1. A memory device comprising:
    a semiconductor having a substrate, at least one PMOS transistor, at least one P well, and at least one NMOS transistor located in said at least one P well; said at least one P well forming at least one P well-to-substrate PN-junction; and
    at least one ground terminal electrically connected to said P well;
said memory device being optically refreshed by a refreshing photocurrent in response to light generated by a light source; and
    said at least one P well-to-substrate PN-junction generating a parasitic photocurrent that flows into said at least one ground terminal.

2. The memory device of claim 1 wherein said at least one PMOS transistor includes a drain-to-substrate PN-junction, said drain-to-substrate PN-junction generating said refreshing photocurrent.

3. The memory device of claim 1 wherein said at least one P-well-to-substrate PN-junction electrically guards said at least one NMOS transistor by preventing said at least one NMOS transistor from generating a discharging photocurrent.

4. The memory device of claim 1 wherein at least part of said at least one NMOS transistor is covered by an opaque layer, said opaque layer acting as a guard against discharging photocurrents.

5. A memory device comprising:

a semiconductor having a substrate, at least one NMOS transistor, at least one N well, and at least one PMOS transistor located in said at least one N well, said at least one PMOS transistor forming at least one PMOS-to-N-well PN-junction; and at least one voltage source terminal electrically connected to said at least one N well;

said at least one PMOS-to-N-well PN-junction generating a refreshing photocurrent in response to light provided by a light source, said photocurrent refreshing said memory device; and said NMOS transistor being at least partly covered by an opaque layer, said opaque layer acting as a guard against discharging photocurrents.

6. The memory device of claim 1 or 5 wherein said at least one NMOS transistor and said at least one PMOS transistor constitute a four-transistor static random access memory cell.

7. The memory device of claim 1 or 5 wherein said light source is selected from the group consisting of a light emitting diode, a display, a keyboard backlight, and ambient light.

8. The memory device of claim 1 or 5 wherein said refreshing does not interfere with a reading or writing operation of said device.

9. The memory device of claim 4 or 5, wherein said opaque layer comprises polysilicon.

* * * * *